(12) United States Patent
Shreter et al.

(10) Patent No.: US 8,901,600 B2
(45) Date of Patent: Dec. 2, 2014

(54) LIGHT-EMITTING DEVICE WITH HETEROPHASE BOUNDARIES

(76) Inventors: Yuri Georgievich Shreter, Saint-Petersburg (RU); Yuri Toomasovich Rebane, Saint-Petersburg (RU); Aleksey Vladimirovich Mironov, Saint-Petersburg (RU)

( * ) Notice: Subject to any disclaimer, the term of this patent is extended or adjusted under 35 U.S.C. 154(b) by 0 days.

(21) Appl. No.: 13/635,136

(22) PCT Filed: Mar. 15, 2011

(86) PCT No.: PCT/RU2011/000159
§ 371 (c)(1),
(2), (4) Date: Sep. 14, 2012

(87) PCT Pub. No.: WO2011/115529
PCT Pub. Date: Sep. 22, 2011

(65) Prior Publication Data
US 2013/0009152 A1   Jan. 10, 2013

(30) Foreign Application Priority Data
Mar. 15, 2010   (RU) ................................ 2010109251

(51) Int. Cl.
*H01L 33/32* (2010.01)
*H01L 33/16* (2010.01)

(52) U.S. Cl.
CPC ................. *H01L 33/16* (2013.01); *H01L 33/32* (2013.01)
USPC .................... 257/103; 257/201; 257/E33.008; 438/47

(58) Field of Classification Search
CPC ......... H01L 33/06; H01L 33/16; H01L 33/18; H01L 33/32
USPC .............. 257/103, 201, E33.008; 438/46, 47
See application file for complete search history.

(56) References Cited

U.S. PATENT DOCUMENTS 6,198,112 B1   3/2001   Ishida et al.
6,342,405 B1   1/2002   Major et al.
(Continued)

FOREIGN PATENT DOCUMENTS

GB   2343294 A   5/2000
JP   5-243613 A   9/1993

OTHER PUBLICATIONS

International Search Report issued in PCT/RU2011/000159 on Aug. 16, 2011.

*Primary Examiner* — John C Ingham
(74) *Attorney, Agent, or Firm* — Hoffmann & Baron, LLP

(57) ABSTRACT

The invention relates to light-emitting devices; in particular, to highly effective light-emitting diodes on the base of nitrides of III group elements of the periodic system. The light-emitting device includes a substrate, a buffer layer formed on the substrate, a first layer from n-type semiconductor formed on the buffer layer, a second layer from p-type semiconductor and an active layer arranged between the first and second layers. The first, second and active layers form interlacing of the layers with zinc blend phase structure and layers with wurtzite phase structure forming heterophase boundaries therebetween. Technical result of the invention is increasing the effectiveness (efficiency) of the light-emitting device at the expense of heterophase boundaries available in the light-emitting device which allow to eliminate formation of the potential wells for holes, to increase the uniformity of the hole distribution in the active layer and to ensure suppression of nonradiative Auger recombination.

10 Claims, 3 Drawing Sheets

(56) References Cited

U.S. PATENT DOCUMENTS

| | | |
|---|---|---|
| 6,359,292 B1 | 3/2002 | Sugawara et al. |
| 6,441,393 B2 * | 8/2002 | Goetz et al. ................ 257/13 |
| 6,787,814 B2 * | 9/2004 | Udagawa ................ 257/101 |
| 6,803,596 B2 * | 10/2004 | Hata ................ 257/13 |
| 6,849,881 B1 | 2/2005 | Harle et al. |
| 2004/0012032 A1 | 1/2004 | Toda et al. |

\* cited by examiner

LIGHT-EMITTING DEVICE WITH HETEROPHASE BOUNDARIES

CROSS-REFERENCE TO RELATED APPLICATIONS

This application is the U.S. National Phase of International Application No. PCT/RU2011/000159 filed on Mar. 15, 2011, which claims priority to Russian Patent Application No. 2010109251 filed on Mar. 15, 2010, both of which are incorporated herein by reference in their entireties.

TECHNICAL FIELD

The invention relates to light-emitting devices; in particular, to high effective light-emitting diodes made on the base of nitrides of III group elements of the periodic system and their solid solutions (referred to hereinafter as III nitrides).

BACKGROUND ART

Light-emitting diode (referred to hereinafter as LED) is a main component of the solid body illumination technology. Voltage applied between two electronic terminals of LED induces electric current to flow through p-n junction, and LED emits light owing to emissive recombination of electrons and holes.

The advantages of LED are a long service life, high reliability, as well as a high coefficient of electric energy-to-luminous radiation transformation.

LEDs emitting infra-red, red and green light are made and sold for a long time. Technology for manufacturing LEDs made on the base of III-nitrides and emitting ultra-violet, blue, green and white light has been essentially improved over the last years (see for example U.S. Pat. No. 7,642,108, U.S. Pat. No. 7,335,920, U.S. Pat. No. 7,365,369, U.S. Pat. No. 7,531,841, U.S. Pat. No. 6,614,060). Owing to this LEDs have become more popular and are used in various fields including illumination.

FIG. 1 shows the known prior art III-nitride LED (Hiromitsu Sakai, Takashi Koide, Hiroyuki Suzuki, Machiko Yamaguchi, Shiro Yamasaki, Masayoshi Koike, Hiroshi Amano and Isamu Akasaki, Jpn. J. Appl. Phys. Vol. 34, Part 2, No 11A, pp. L1429, Jan. 11, 1995).

III-nitride LED 100 has a layer structure consisting of a substrate 110, thin buffer layer 120, n-type layer 130 with n-type contact 170 applied (referred to hereinafter as n-contact), p-type layer 150 with p-type contact 160 applied (referred to hereinafter as p-contact), and the active layer 140. In addition, the principal part of LED is an active layer 140 within which generation of light radiation occurs as a result of recombination process of electrons and holes. In usual III-nitride LED, n-type layer 130, p-type layer 150 and active layer 140 have one crystal structure—one crystal phase of III-nitride semiconductor. Usually, this crystal structure corresponds to wurtzite structure. However, an active layer of II-nitride LED 100 can be made from III-nitride semiconductor with chemical composition dissimilar from chemical compositions of n-type layer 130 and p-type layer 150 (Hiromitsu Sakai, Takashi Koide, Hiroyuki Suzuki, Machiko Yamaguchi, Shiro Yamasaki, Masayoshi Koike, Hiroshi Amano and Isamu Akasaki, Jpn. J. Appl. Phys. Vol. 34, Part 2, No 11A, pp. L1429, Jan. 11, 1995). Thus, this III-nitride LED comprises two heteroboundaries between the layers of one crystal phase with dissimilar chemical composition which form a double heterostructure or a quantum well. III-nitride double heterostructure or a quantum well comprises two I type heteroboundaries which form potential wells both for electrons as well as for holes.

The drawback of the structures with I-type heteroboundaries formed from the III-nitride semiconductors of one crystal phase with different chemical composition is that they form potential wells both for electrons and for holes and thus prevent uniform filling of the active layer with holes because their mass in III-nitride semiconductors essentially larger than mass of electrons. In the result, only one well closest to the p-type layer is filled with electrons and holes and emits the larger part of light in the structures with several quantum wells. Density of the carriers in the quantum well closest to the p-type layer becomes high at a large current density and thus LED effectiveness drops because of nonlinear recombination processes such as Auger recombination.

It is clear from the above that effectiveness of light generation by the usual light-emitting semiconductor device (LED) on the base of one crystal phase of III-nitrides is limited at high current densities because of non-homogeneous distribution of holes in the active layer and nonlinear recombination processes.

Thus, the object of the invention is an increasing the effectiveness of luminous radiation by the light-emitting device.

SUMMARY

To address the aforementioned object, the present invention provides a light-emitting device with a new structure. The proposed light-emitting semiconductor device has a heterophase structure which comprises heterophase boundaries between the phase with zinc blende structure (referred to hereinafter as zinc blende phase) and phase with wurtzite structure (referred to hereinafter as wurtzite phase) which are the II type heteroboundaries unlike the usual I type heteroboundaries without changing the phase (Rebane Y. T., Shreter Y. G., Albrecht M. Physica Status Solidi A. 1997. Volume 164. Page 141; Corfdir P., Leferbre P., Levrat J., Dussaigne A., Ganiere J.-D., Martin D., Ristic J., Zhu T., Grandjean N., Deveaud-Pledran B. Journal of Applied Physics, 2009. Volume 105, page 043192).

Concepts of heteroboundaries or heterojunctions are well known from literature.

Heteroboundaries and heterojunctions—these are the boundaries and junctions between the semiconductors with different chemical compositions but having the same crystal structure, for example, the boundary between wurtzite phase GaN and wurtzite phase $Al_xGa_{1-x}N$.

This application uses the concept of heterophase boundary in the following meaning:

Heterophase boundaries are the boundaries between semiconductors with different crystal structure, for example, the boundary between wurtzite phase GaN and zinc blende phase GaN.

Semiconductors constituting the heterophase boundary may have both the same chemical composition, for example, the boundary between wurtzite phase GaN and zinc blende phase GaN, and different chemical compositions, for example, the boundary between wurtzite phase $Al_xGa_{1-x}N$ and zinc blende phase GaN.

Since using the II type heteroboundaries allows to eliminate formation of the potential wells for holes, distribution of holes in the active layer becomes more homogeneous, and effectiveness of the light-emitting device increases at large current densities. Besides, this invention proposes LED with several quantum wells for electrons formed by the heterophase boundaries between zinc blende phase and wurtzite phase. In these quantum wells having a zinc blende phase structure nonradiative Auger recombination is essentially suppressed (Kris T. Delaney, Patrick Rinke and Chris G. Van de Walle, Applied Physics Letters, 2009, Volume 94, page 191109) and thus, the proposed light-emitting device exceeds for effectiveness the known light-emitting devices with several quantum wells having wurtzite phase structure.

The present invention provides a light-emitting device with heterophase structure which comprises heterophase boundaries between zinc blende phase and wurtzite phase. This invention differs from the existing analogues for heterophase boundaries.

The proposed light-emitting device has a substrate; a buffer layer formed on the substrate; a first layer made from n-type semiconductor formed on the buffer layer; a second layer made from p-type semiconductor; an active layer arranged between the first and the second layers. The first, the second and the active layers form interlacing of the layers with zinc blende phase structure and layers with wurtzite phase structure creating the heterophase boundaries between them.

The active layer can be made from semiconductor with zinc blende phase structure, and the first and second layers can be made from semiconductor with wurtzite phase structure.

The substrate can be made from aluminum oxide, silicon carbide or gallium nitride.

The buffer layer can be made from gallium nitride or of aluminum nitride.

The first layer can be made from gallium nitride doped with silicon. The second layer can be made from gallium nitride doped with magnesium.

Preferably, the active layer is made from gallium nitride (GaN) or a solid solution of boron-aluminum-gallium-indium nitride.

In one of the embodiments the active layer can be made composite consisting of the layers from semiconductor with zinc blende phase structure and from the barriers with wurtzite phase structure formed between them creating heterophase boundaries.

The technical result of the invention is increasing the effectiveness of the light-emitting device thanks to heterophase boundaries available in the light-emitting device which allow to eliminate creating of the potential wells for holes, to increase homogeneity of the holes' distribution in the active layer and to ensure suppression of nonradiative Auger recombination. Besides, the heterophase boundaries allow to prevent spreading of the grown-in dislocations which increase nonradiative recombination and leakage currents, and thanks to this fact to obtain the more reliable and effective light-emitting semiconductor device.

BRIEF DESCRIPTION OF THE DRAWINGS

The invention is illustrated in the accompanying drawings in which various embodiments thereof are represented.

DETAILED DESCRIPTION

The present invention will become clear in terms of several embodiments given below. It should be noted, that the subsequent description of these embodiments is an illustrative one only and is not an exhaustive one.

Figure 1:
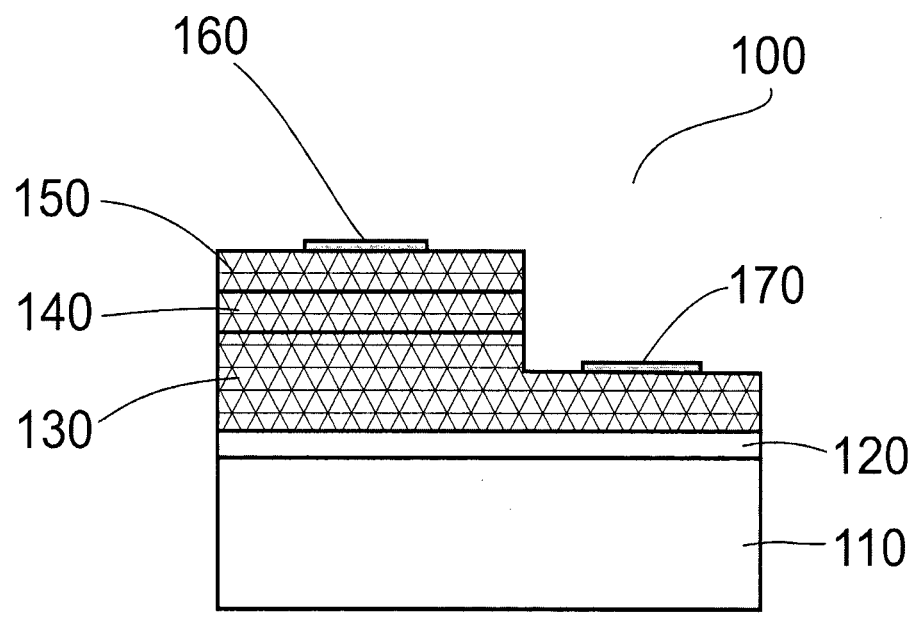
FIG. 1 represents a scheme of a prior art light-emitting diode with double heterostructure. Wurtzite phase of the semiconductor is marked with triangular graticule.
Figure 2:
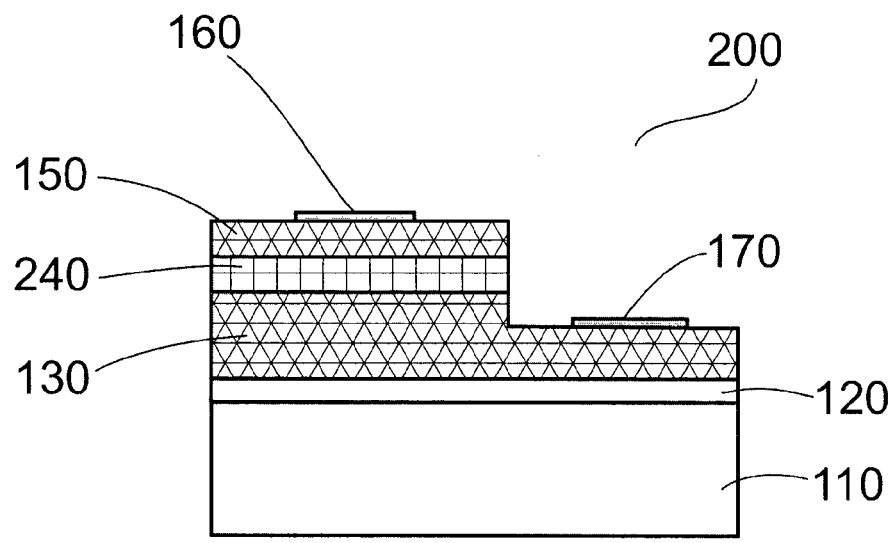
FIG. 2 represents a scheme of a light-emitting diode with double heterophase structure on an isolating substrate. Wurtzite phase of the semiconductor is marked with triangular graticule, and zinc blende phase is marked with square graticule.

FIG. 2 shows a scheme of LED 200 with heterophase structure formed on an isolating substrate made, for example, from aluminum oxide, silicon carbide or gallium nitride. LED 200 consists of the isolating substrate 110, a buffer layer 120 made, for example, from gallium nitride or aluminum nitride, a first layer 130 made from n-type semiconductor with wurtzite phase with n-contact 170 applied, a second layer 150 made from p-type semiconductor with wurtzite phase with p-contact 160 applied, and an active layer 240 made from the semiconductor with zinc blende phase arranged between the first and second layers. The base of LED 200 with heterophase structure is two heterophase boundaries.

A first heterophase boundary is formed between the first layer 130 made from n-type semiconductor with wurtzite phase and the active layer 240 made from the semiconductor with zinc blende phase. A second heterophase boundary is formed between the active layer 240 made from the semiconductor with zinc blende phase and the second layer 150 made from p-type semiconductor with wurtzite phase.

Using of the heterophase structure allows to eliminate potential wells for holes whereby the distribution of the holes in the active layer becomes more homogeneous, and effectiveness of the light-emitting device increases. When thickness of the active layer 240 is over the range of 10-100 nm, the potential well for electrons does not ensure quantum confinement, and LED operates as a light diode with a single heterophase quantum well. The light diode with heterophase structure comprises the active layer made from III-nitride semiconductor with zinc blende phase in which nonradiative Auger recombination is essentially suppressed, and therefore the light diode with heterophase structure essentially exceeds for effectiveness the usual ones made completely from III-nitride semiconductor with crystal structure of wurtzite phase.

Figure 3:
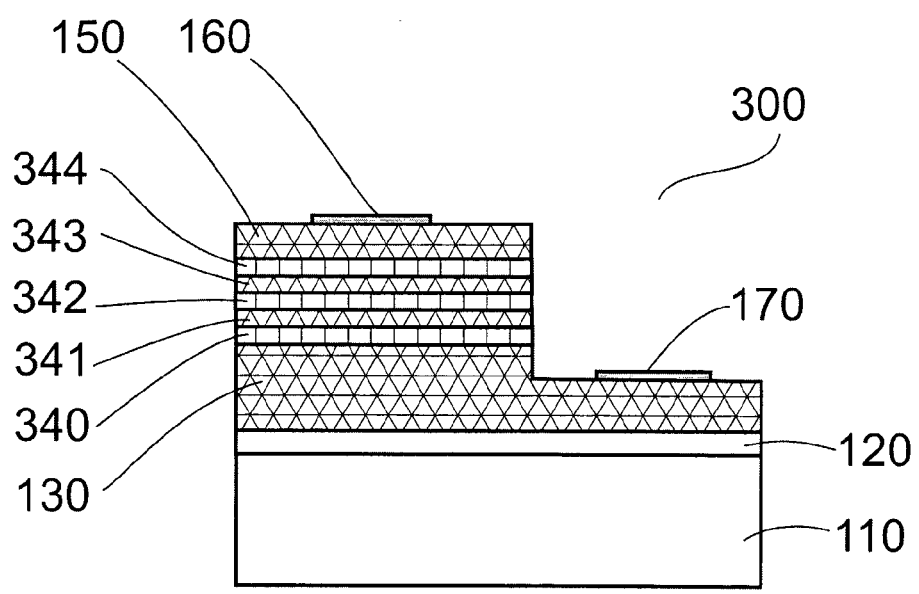
FIG. 3 represents a scheme of a light-emitting diode with several heterophase quantum wells, namely with three heterophase quantum wells, on the isolating substrate. Wurtzite phase of the semiconductor is marked with triangular graticule, and zinc blende phase is marked with square graticule.

FIG. 3 shows a general scheme of LED 300 with several heterophase quantum wells on the isolating substrate. LED 300 consists of the isolating substrate 110, the buffer layer 120, the first layer 130 made from n-type semiconductor with wurtzite phase with n-contact 170 applied, the second layer 150 made from p-type semiconductor with zinc sulfide phase with p-contact 160 applied. Between the first and the second layers there is the composite active layer, consisting of the layers 340, 342, 344 made from semiconductor with zinc blende phase structure and of the barriers 341, 343 with zinc sulfide phase structure arranged therebetween. Thus, each of the heterophase quantum wells obtained is formed by two heterophase boundaries between the layers 340, 342, 344 made from semiconductor with zinc blende phase and layers 341, 343 made from semiconductor with zinc sulfide phase. Using of the several heterophase quantum wells allows to eliminate potential wells for holes whereby the distribution of the holes in the active layer becomes more homogeneous, and effectiveness of the light-emitting device increases. Thickness of the active layer made from semiconductor with zinc blende phase in LED with several heterophase quantum wells is over the range of 1-10 nm, which ensures quantum confinement for electrons. Moreover, LED 300 with several heterophase quantum wells has the active layer made from III-nitride semiconductor with zinc blende phase in which the nonradiative Auger recombination is essentially suppressed and therefore such LED essentially exceeds for effectiveness the usual light diodes made completely from III-nitride semiconductor with crystal structure of wurtzite phase.

Figure 4:
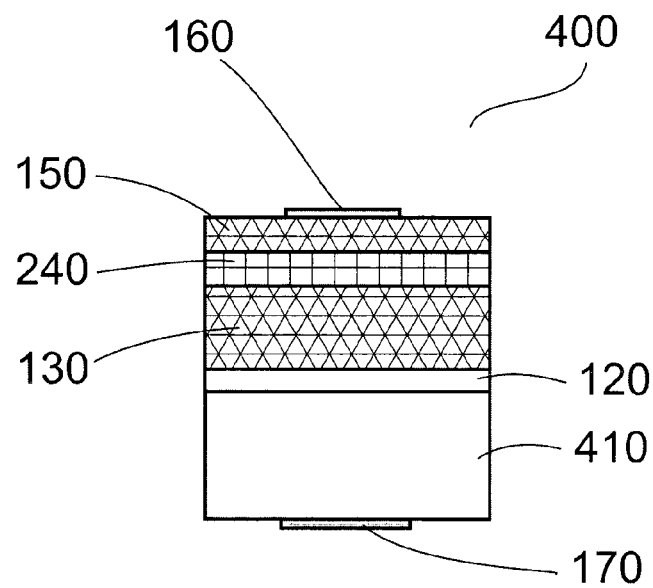
FIG. 4 represents a scheme of a light-emitting diode with double heterophase structure on a conductive substrate. Wurtzite phase of the semiconductor is marked with triangular graticule, and zinc blende phase is marked with square graticule.

FIG. 4 shows a general scheme of LED 400 with heterophase structure formed on the conductive substrate. LED 400 consists of the conductive substrate 110 with n-contact 170 applied, buffer layer 120, the first layer 130 made from n-type semiconductor with wurtzite phase, the second layer 150 made from p-type semiconductor with zinc sulfide phase with p-type contact 160 applied, and of the active layer 240 made from semiconductor with zinc blende phase arranged between the first and the second layers. Heterophase boundary between the zinc blende phase and wurtzite phase in III-nitrides is the heteroboundary of II type.

The base of LED 200 with heterophase structure is two heterophase boundaries.

The first heterophase boundary is formed between the first layer 130 made from n-type semiconductor with zinc sulfide phase and the active layer 240 made from semiconductor with zinc blende phase. The second heterophase boundary is formed between the active layer 240 made from semiconductor with zinc blende phase and the second layer 150 made from p-type semiconductor with wurtzite phase. Using of the heterophase structure in the light-emitting device allows to eliminate potential wells for holes whereby distribution of the holes in the active layer becomes more homogeneous, and effectiveness of the light-emitting device increases at large current densities. When thickness of the active layer 240 made from semiconductor with zinc blende phase is over the range of 10-100 nm, the potential well for electrons does not ensure quantum confinement, and LED operates as a light diode with a double heterophase structure. When thickness of the active layer 240 made from semiconductor with zinc blende phase is over the range of 1-10 nm, potential well for electrons ensures quantum confinement and the device operates as a light diode with a single heterophase quantum well. The light diode with heterophase structure has an active layer made from III-nitride semiconductor with zinc blende phase in which the nonradiative Auger recombination is essentially suppressed. Therefore both the light diode with double heterophase structure, as well as the light diode with a single heterophase quantum well exceeds for effectiveness the usual light diodes made completely from III-nitride semiconductor with crystal structure of wurtzite phase.

Figure 5:
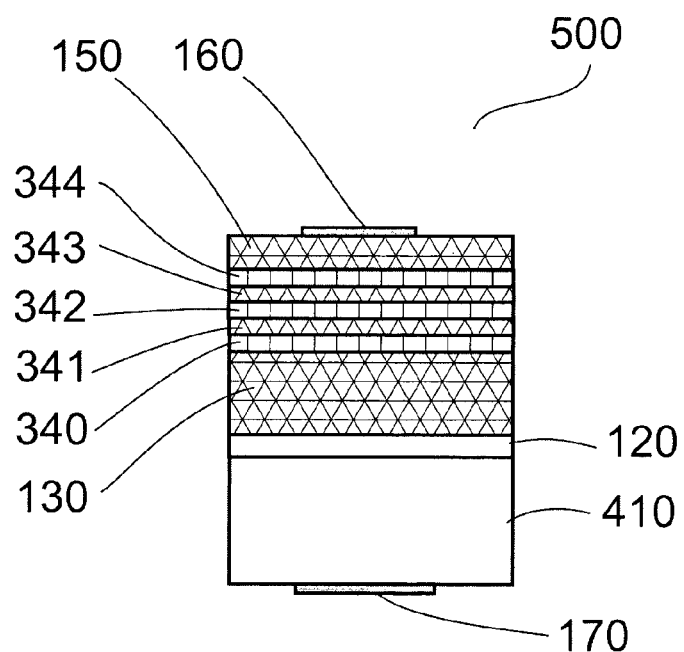
FIG. 5 represents a scheme of a light-emitting diode with several heterophase quantum wells, namely with three heterophase quantum wells, on the conductive substrate. Wurtzite phase of the semiconductor is marked with triangular graticule, and zinc blende phase is marked with square graticule.

FIG. 5 shows a general scheme of LED 500 on the conductive substrate. LED 500 consists of the conductive substrate 110 with the n-contact 170 applied, the buffer layer 120, the first layer 130 made from n-type semiconductor with wurtzite phase, the second layer 150 made from p-type semiconductor with wurtzite phase with the p-contact 160 applied and the active layer arranged between the first and second layers and made composite. It consists of the layers 340, 342, 344 made from semiconductor with zinc blende phase structure, and of the barriers 341, 343 with wurtzite phase structure arranged between the layers. Each heterophase quantum well is formed by two heterophase boundaries between the layers 340, 342, 344 made from semiconductor with zinc blende phase and the layers 341, 343 made from semiconductor with wurtzite phase. Using of the heterophase structures with several quantum wells allows to eliminate potential wells for holes whereby distribution of holes in the active layer becomes more homogeneous and effectiveness of luminous radiation of the light-emitting device increases. Thickness of the active layer made from semiconductor with zinc blende phase in LED with several heterophase quantum wells is over the range of 1-10 nm which ensures the quantum confinement for electrons. Moreover, nonradiative Auger recombination is essentially suppressed in the heterophase quantum wells made from III-nitride semiconductor with zinc blende phase as compared with wurtzite phase, and therefore, LED 500 with several heterophase quantum wells exceeds for effectiveness the known light diodes with several quantum wells made from III-nitride semiconductor with wurtzite phase.

The above light-emitting devices with heterophase boundaries ensure the increased effectiveness of luminous radiation because of the more homogeneous distribution of holes and suppression of Auger recombination in the active potential wells. Besides, heterophase boundaries prevent extension of the grown-in dislocations contributing the nonradiative recombination and leakage currents, thus, reliability and effectiveness of the proposed light-emitting device with heterophase boundaries are additionally increased.

Operation of the device is described by an example of FIG. 2. The device 200 as shown in FIG. 2 operates as follows. When applying voltage to contacts 170, 160, current causes to flow through the heterophase structure formed by the layers 130, 240, and 150. In addition, current is transferred by electrons in the layer 130 and by holes in the layer 150 having a crystal structure of wurtzite phase, and recombination of electrons and holes occurs in the active layer 240 having crystal structure of zinc blende phase. As a result of recombination, a part of electrical energy transforms into light and is emitted by the device 200. Heterophase boundaries between the active layer 240 and layers 130 and 150 are the heteroboundaries of II type; therefore, choice of composition of solid solution of III-nitride semiconductors for the layers 130, 240 and 150 allows to ensure a deep potential well for electrons and simultaneously shallow one for holes in the active layer 240. Holes in III-nitride semiconductors have a low mobility, and a small depth of the potential well for them facilitates their motion in the active layer and improves homogeneity of their distribution over the active layer. Effectiveness (efficiency) of transformation of electric energy into light is determined by the ratio of radiative recombination coefficient to nonradiative recombination coefficient. The active layer of the device 240 is made from III-nitride semiconductor having a crystal structure of zinc blende phase in which nonradiative Auger recombination is essentially suppressed as compared with wurtzite phase. Thus, as a result of recombination of electrons and holes in the layer 240, a larger part of electric energy transforms to light, and a smaller part of electric energy transforms to thermal energy.

The device 300 shown in FIG. 3 operates similar to the device 200 shown in FIG. 2, but in the active area, the device 300 has three layers 340, 342 and 344 with a crystal structure of zinc blende phase creating three heterophase quantum wells. When applying voltage to contacts 170, 160, current causes to flow through the heterophase structure formed by the layers 130, 340, 341, 342, 343, 344 and 150. In addition, current is transferred by electrons in the layer 130 and by holes in the layer 150 having a crystal structure of wurtzite phase. Recombination of electrons and holes occurs in three heterophase quantum wells formed by the layers 340, 342 *b* 344 with a crystal structure of zinc blende phase. As a result of recombination, a part of electric energy transforms to light and is emitted by the device 300.

Heterophase boundaries between the layers 340, 342, 344 made from semiconductor with zinc blende phase and the layers 341, 343 made from semiconductor with wurtzite phase forming three heterophase quantum wells are the heteroboundaries of II type. Choice of composition of solid solution of III-nitride semiconductors for the layers 340, 341, 342, 343 and 344 allows to provide deep potential wells for electrons and simultaneously shallow ones for holes. Holes in III-nitride semiconductors have a low mobility, and a small depth of the potential well for them facilitates their motion in the active layer and improves homogeneity of their distribution over the active layer. Effectiveness (efficiency) of transformation of electric energy into light is determined by the ratio of radiative recombination coefficient to nonradiative recombination coefficient. The heterophase quantum wells formed by the layers 340, 342 and 344 in which recombination of electrons and holes occurs are made from III-nitride semiconductor having a crystal structure of zinc blende phase in which nonradiative Auger recombination is essentially suppressed as compared with wurtzite phase. Thus, as a result of recombination of electrons and holes in the quantum wells formed by the layers 340, 342 and 344, the larger part of electric energy transforms to light, and the smaller part of electric energy transforms to thermal energy.

Devices shown in FIGS. 4 and 5 operates in the way similar to the above devices shown in FIG. 2 and FIG. 3 respectively, but they are made on the conducting substrates and therefore have n-contacts applied to the conducting substrates 410.

Thus, thanks to the fact that in the light-emitting device there are heterophase boundaries which allow to eliminate formation of the potential wells for holes, to increase homogeneity of holes distribution in the active layer and to ensure suppression of nonradiative Auger recombination, effectiveness (efficiency) of the light-emitting device increases.

Despite the fact that this invention has been described and represented by the examples of the invention embodiments, it should be noted that this invention is not limited by the given examples in any case.

What is claimed is:

1. A light-emitting device comprising:
   a substrate;
   a buffer layer formed on the substrate;
   a first layer made from n-type semiconductor formed on the buffer layer;
   a second layer made from p-type semiconductor;
   an active layer arranged between the first and second layers,
   wherein the first, the second and the active layers form interlacing of the layers with a zinc blende phase structure and the layers with a wurtzite phase structure forming heterophase boundaries therebetween, wherein the active layer is made from a III-nitride semiconductor with the zinc blende phase structure, the first and second layers are made from a semiconductor with the wurtzite phase structure.

2. The light-emitting device according to claim 1, wherein the substrate is made from aluminum oxide.

3. The light-emitting device according to claim 1, wherein the substrate is made from silicon carbide.

4. The light-emitting device according to claim 1, wherein the substrate is made from gallium nitride.

5. The light-emitting device according to claim 1, wherein the buffer layer is made from gallium nitride.

6. The light-emitting device according to claim 1, wherein the buffer layer is made from aluminum nitride.

7. The light-emitting device according to claim 1, wherein the first layer is made from gallium nitride doped with silicon.

8. The light-emitting device according to claim 1, wherein the second layer is made from gallium nitride doped with magnesium.

9. The light-emitting device according to claim 1, wherein the active layer is made from gallium nitride (GaN) or of the solid solution of boron-aluminum-gallium-indium nitride $(B_xAl_yGa_zIn_{1-z}N)$.

10. The light-emitting device according to claim 1, wherein the active layer is made composite comprising the layers from the semiconductor with the zinc blende phase structure and barriers with the wurtzite phase structure arranged therebetween forming the heterophase boundaries.

\* \* \* \* \*